United States Patent
Tanaka

(10) Patent No.: US 7,103,210 B2
(45) Date of Patent: Sep. 5, 2006

(54) POSITION DETECTION APPARATUS AND EXPOSURE APPARATUS

(75) Inventor: Hiroshi Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/131,428

(22) Filed: May 18, 2005

(65) Prior Publication Data

US 2005/0220334 A1    Oct. 6, 2005

Related U.S. Application Data

(62) Division of application No. 09/521,210, filed on Mar. 8, 2000, now Pat. No. 6,925,203.

(30) Foreign Application Priority Data

Mar. 9, 1999  (JP) .................................. 11-062004

(51) Int. Cl.
*G06K 9/00* (2006.01)

(52) U.S. Cl. ...................... 382/151; 382/151; 382/199; 382/287; 250/492.22

(58) Field of Classification Search ................ 382/147, 382/151, 181, 184, 190, 199, 209, 216, 218, 382/219, 266, 287; 250/491.1, 492.2, 492.22, 250/559.36; 349/95, 158; 430/5, 296; 356/401
See application file for complete search history.

(56) References Cited

U.S. PATENT DOCUMENTS

| | | | |
|---|---|---|---|
| 4,639,604 A | 1/1987 | Murakami et al. | 250/548 |
| 4,688,088 A * | 8/1987 | Hamazaki et al. | 348/94 |
| 4,808,002 A * | 2/1989 | Tojo et al. | 356/401 |
| 4,814,829 A | 3/1989 | Kosugi et al. | 355/43 |
| 4,860,374 A | 8/1989 | Murakami et al. | 382/48 |
| 4,875,092 A * | 10/1989 | Yamanishi et al. | 358/526 |
| 5,073,958 A | 12/1991 | Imme | 382/22 |
| 5,136,661 A | 8/1992 | Kobayasi et al. | 382/48 |
| 5,160,957 A | 11/1992 | Ina et al. | 355/43 |
| 5,602,937 A | 2/1997 | Bedrosian et al. | 382/151 |
| 5,659,384 A * | 8/1997 | Ina | 355/53 |
| 5,692,072 A | 11/1997 | Hashimoto | 382/199 |
| 5,696,838 A | 12/1997 | Chiu et al. | 382/159 |
| 5,754,677 A | 5/1998 | Kawada | 382/141 |
| 5,771,085 A * | 6/1998 | Ochi et al. | 349/158 |
| 5,825,913 A | 10/1998 | Rostami et al. | 382/151 |
| 5,841,520 A * | 11/1998 | Taniguchi | 355/53 |
| 6,188,467 B1 | 2/2001 | Yamatsu et al. | 355/72 |
| 6,312,859 B1 | 11/2001 | Taniguchi | 430/22 |

(Continued)

OTHER PUBLICATIONS

"Image Technology & Information Display," Video Information Oct. 1992, vol. 24, No. 10, 1992. pp. 99-103 and 128 (with partial English translation).

(Continued)

*Primary Examiner*—Sheela Chawan
(74) *Attorney, Agent, or Firm*—Fitzpatrick, Cella, Harper & Scinto

(57) ABSTRACT

A position detection apparatus for detecting a position of a mark on an object includes a camera which captures an image of the mark, an extraction section which extracts a plurality of edge positions of the mark based on a signal derived from the image of the mark, each of the edge positions being associated with a combination of a direction and a polarity of the signal, and a determination section which determines a position of the mark, by comparing each of the plurality of extracted edge positions with a corresponding one of templates prepared for the respective combinations.

19 Claims, 8 Drawing Sheets

U.S. PATENT DOCUMENTS 6,317,195 B1  11/2001  Taniguchi .................... 355/53
6,333,786 B1  12/2001  Uzawa et al. ................ 356/401
6,421,458 B1   7/2002  Michael et al. ............. 382/151

OTHER PUBLICATIONS

Cognex 4000/5000 SMD Placemenmt Guidance Package User's Manual 1996, pp. 179-223.

* cited by examiner

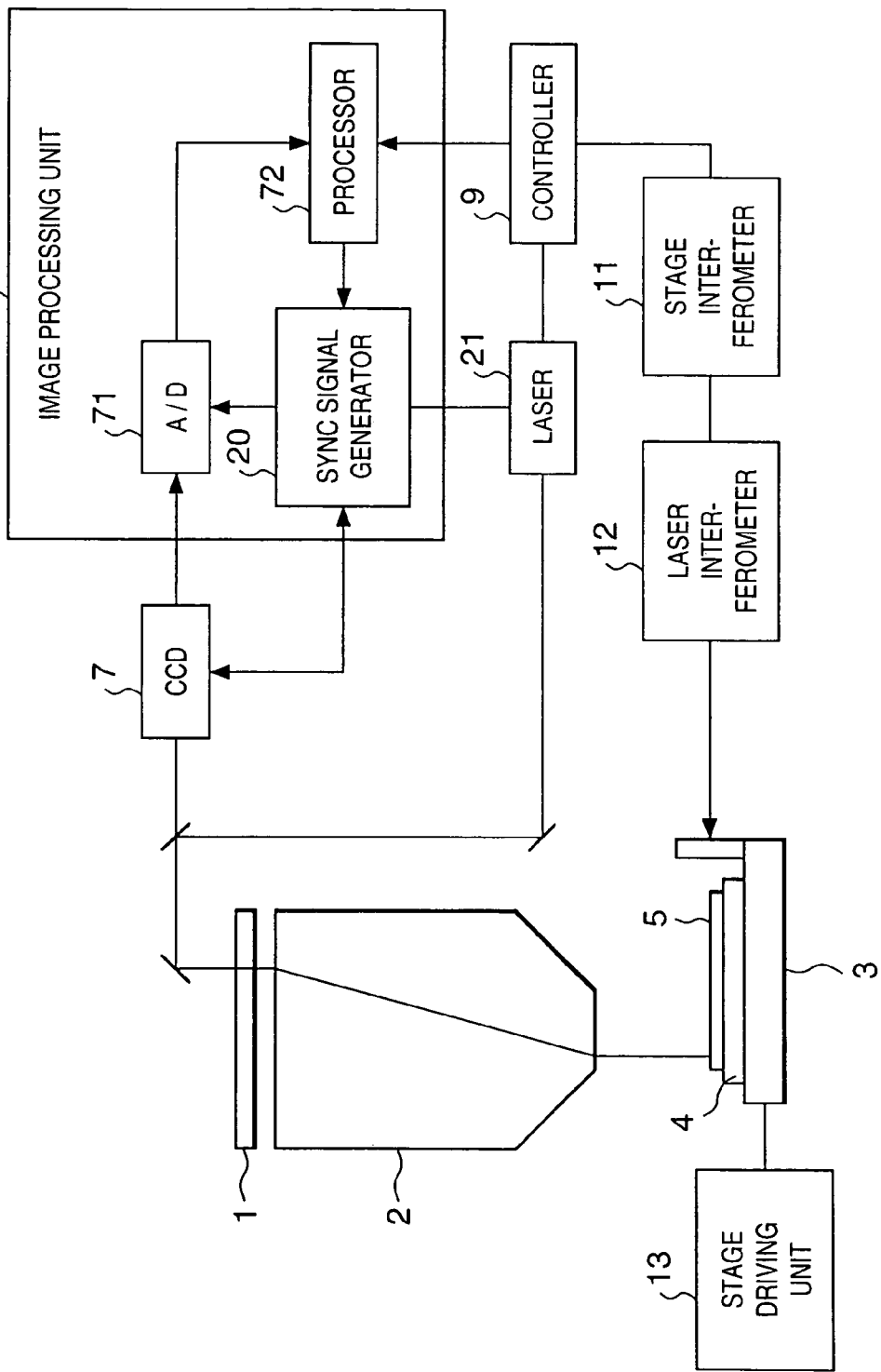

OVER

UNDER

LEFT

RIGHT

OVER

UNDER

LEFT

RIGHT

//POSITION DETECTION APPARATUS AND EXPOSURE APPARATUS

This application is a divisional application of patent application Ser. No. 09/521,210, filed on Mar. 8, 2000 now U.S. Pat. No. 6,925,203.

FIELD OF THE INVENTION

The present invention relates to a position detection apparatus for detecting the position of a mark on an object and an exposure apparatus using the position detection apparatus.

BACKGROUND OF THE INVENTION

In an exposure apparatus for manufacturing, e.g., semiconductor devices that are increasingly shrinking in their feature sizes, before a reticle pattern is projected onto a wafer by exposure, the wafer and reticle are aligned.

Alignment includes two techniques: pre-alignment and fine alignment. In pre-alignment, a feed shift amount generated when a wafer is loaded from a wafer conveyor apparatus onto a wafer chuck on a stage in a semiconductor exposure apparatus is detected, and the wafer is coarsely aligned within an accuracy with which subsequent fine alignment can be normally processed. In fine alignment, the position of the wafer placed on the wafer chuck on the stage is accurately measured, and the wafer and reticle are precisely aligned such that the alignment error between the wafer and reticle fall within the allowable range. The pre-alignment accuracy is, e.g., about 3 μm. The fine alignment accuracy is, e.g., 80 nm or less for a 64 MDRAM although it changes depending on the requirement for wafer work accuracy.

Pre-alignment requires detection in a very wide range because the wafer feed shift generated when the conveyor apparatus feeds a wafer onto the chuck is detected, as described above. The detection range is generally about 500 μm square. As a method of detecting the X- and Y-coordinates of one mark and performing pre-alignment, pattern matching is often used.

Pattern matching is roughly classified into two techniques. In one technique, a mark image is binarized, the binary image is matched with a predetermined template, and a position at which the binary image and template have the highest correlation is determined as a mark position. In the other technique, the correlation between a mark image that remains a grayscale image and a template having grayscale information is calculated. As the latter method, normalization correlation is often used.

In pre-alignment, the mark to be used must be small although the detection range is very wide. This is because as a pattern other than a semiconductor element is used as a mark, the mark is preferably as small as possible to make the semiconductor element area as large as possible. Hence, the mark is often laid out in a region that is not used as an element, e.g., on a scribing line. The mark size is therefore limited by the scribing line width.

The scribing line width is becoming narrower year by year because of the high efficiency of semiconductor manufacturing and improved work accuracy in recent years. Currently, the scribing line width is as small as 100 μm or less, and accordingly, the mark size is also 60 μm or less.

On the other hand, to manufacture a semiconductor device with high density, a wafer is processed through new processes.

A problem associated with pre-alignment mark detection will be described with reference to FIGS. 6A to 6H. FIG. 6A shows a layout in which a semiconductor element pattern is adjacent outside a cross-shaped mark 100, in which a portion "win" long in the horizontal direction is a signal detection region. FIGS. 6B and 6D show detection signal waveforms, and FIGS. 6C and 6E show the wafer sectional structures corresponding to the signals shown in FIGS. 6B and 6D. FIG. 6F also shows the cross-shaped detection mark 100. FIG. 6G shows the detection signal waveform. FIG. 6H shows the wafer section structure corresponding to FIG. 6G.

FIG. 6E shows the sectional structure of the mark after an ultra low step process. FIG. 6H shows the sectional structure of the mark after a CMP process. In these examples, it is difficult to detect the pre-alignment mark.

In pre-alignment, generally, a mark once formed is continuously used for position detection even in the subsequent processes. However, as layers are deposited on the mark, it gradually becomes hard to observe the mark. In the sectional structure shown in FIG. 6E, since a mark having low reflectivity and small step difference is present in a material having high reflectivity and large step difference, the mark can hardly be detected. In addition, since various layers are deposited on the mark, the image obtained by reading the mark may have low contrast and much noise.

The examples shown in FIGS. 6A to 6H suggest that along with the progress in techniques of manufacturing a semiconductor device with high density, processes that make detection of a pre-alignment mark present in a wide detection range by the conventional pattern matching have emerged and they present problems.

For example, a shown in FIG. 6E, when the mark has a small step differences; although the peripheral pattern has a large step and high reflectivity, an image signal shown in FIG. 6D is obtained. The image signal shown in FIG. 6D is a signal in the region "win" shown in FIG. 6A, which is obtained by sensing the pre-alignment mark 100 irradiated by dark field illumination. The ordinate represents a video signal voltage, and the abscissa represents a coordinate. When the signal is binarized using a predetermined threshold value, the mark disappears because the signal level of the mark portion is low. For this reason, the mark cannot be recognized by template matching.

Even with normalization correlation which is known as a detection method for a grayscale image, it is also difficult to detect a mark in an image with small step difference and low contrast or a noisy image. Especially, the detection rate of normalization correlation tends to be low when the influence of noise is large, or mark defects occur in the wafer process. Additionally, the process time is long because of the complex calculation method.

Various approximation calculations have also been examined to solve the above problem. However, the problem of a low detection rate for a low-contrast image remains unsolved.

Another well-known mark detection method is the vector correlation method (Video Information 1992/2). The vector correlation method can obtain a high detection rate even when the mark image has noise or the mark has a defect. In the vector correlation method, attribute information representing the feature of edge information is extracted together with the edge of the mark. With this correlation calculation method, the extracted feature is compared with a template to detect the mark position.

In the vector correlation method, a high-contrast mark and low-contrast mark cannot be detected using the same parameter in extracting the edge information of the marks. Hence, the edge extraction parameter needs to be tuned.

SUMMARY OF THE INVENTION

The present invention has been made in consideration of the above situation, and has as its object to stably detect the position of a mark even in a mark image that is difficult to detect, e.g., a low-contrast mark image, a noisy mark image, or a mark image whose mark has a defect generated in the wafer process. Especially in association with the vector correlation method, it is another object of the present invention to optimize a mark detection method in accordance with a mark image in extracting information related to an edge and to stably detect the mark position and, more specifically, to cope with any mark image by self learning and to stably detect the mark position.

According to the first aspect of the present invention, there is provided a position detection apparatus for detecting a position of a mark on an object, comprising an extraction section for observing the mark and extracting a plurality of edge information data of the mark in correspondence with attribute information representing features of the edge information, respectively, a position determination section for comparing each edge information with one of a plurality of templates, which is specified by attribute information corresponding to the edge information and evaluating a plurality of comparison results obtained by comparison to determine the position of the mark, and a control section for changing at least one of an extraction rule in the extraction section and an evaluation rule in the position determination section on the basis of the plurality of comparison results by the position determination section and causing the extraction section and the position determination section to execute processing again.

In the position detection apparatus according to the first aspect of the present invention, each attribute information data preferably represents an edge portion of the mark, which is associated with the corresponding edge information. In addition, each attribute information data preferably represents one of a plurality of extraction conditions under which the corresponding edge information is extracted.

In the position detection apparatus according to the first aspect of the present invention, preferably, the extraction section extracts, as each edge information data, information representing an edge position shifted from an actual edge position of the mark by a predetermined distance in one of a plurality of predetermined directions, and each attribute information data represents a direction in which an edge position associated with the corresponding edge information is shifted from the actual edge position of the mark by the predetermined distance.

In the position detection apparatus according to the first aspect of the present invention, the extraction section preferably comprises an image sensing section for sensing an image of the mark, a differential processing section for differentiating the mark image as an image sensing result, and an edge information generation section for processing the differential result to generate the edge information corresponding to the attribute information.

Preferably, the differential processing section calculates a change rate of an image signal of the mark image along at least two directions of the mark image, and each attribute information data is associated with one of the at least two directions.

Alternatively, each attribute information data is preferably associated with a sign of the differential result by the differential processing section.

Alternatively, preferably, the differential processing section calculates a change rate of an image signal of the mark image across the mark image along row and column directions of the mark image, and each attribute information data is associated with one of the row and column directions and the differential result by the differential processing section.

In the position detection apparatus according to the first aspect of the present invention, each template preferably includes, as information to be compared with the edge information, position information of a plurality of points defining a corresponding edge.

In the position detection apparatus according to the first aspect of the present invention, the extraction section preferably performs noise removal processing for an observation result of the mark and then executes edge information extraction.

In the position detection apparatus according to the first aspect of the present invention, the extraction section preferably increases a line width associated with the extracted edge information.

In the position detection apparatus according to the first aspect of the present invention, the extraction rule and/or the evaluation rule determined by the control section is preferably stored in a memory and used as a base for processing to be executed later.

In the position detection apparatus according to the first aspect of the present invention, the extraction section preferably observes the mark under dark field illumination.

According to the second aspect of the present invention, there is provided a position detection apparatus for detecting a position of a mark on an object, comprising an extraction section for observing the mark and extracting edge information of the mark, a position determination section for comparing the edge information with a template and evaluating a comparison result to determine the position of the mark, and a control section for changing at least one of an extraction rule in the extraction section and an evaluation rule in the position determination section on the basis of the evaluation result by the position determination section and causing the extraction section and the position determination section to execute processing again.

According to the third aspect of the present invention, there is provided an exposure apparatus comprising a projection optical system for projecting a pattern onto a substrate, a chuck on which the substrate is placed, and a position detection section for detecting a position of a mark on the substrate placed on the chuck, wherein the substrate is aligned on the basis of a detection result by the position detection section, and then, the substrate is exposed using the pattern, and position detection section comprising an extraction section for observing the mark and extracting a plurality of edge information data of the mark in correspondence with attribute information representing features of the edge information, respectively, a position determination section for comparing each edge information data with one of a plurality of templates, which is specified by attribute information corresponding to the edge information and evaluating a plurality of comparison results obtained by comparison to determine the position of the mark, and a control section for changing at least one of an extraction rule in the extraction section and an evaluation rule in the position determination section on the basis of the plurality of comparison results by the position determination section and causing the extraction section and the position determination section to execute processing again.

In the exposure apparatus according to the third aspect of the present invention, the extraction section of the position detection section preferably observes the mark with an off-axis scope or TTR (Through The Reticle) or TTL (Through The Lens).

According to the fourth aspect of the present invention, there is provided an exposure apparatus comprising a projection optical system for projecting a pattern onto a substrate, a chuck on which the substrate is placed, and a position detection section for detecting a position of a mark on the substrate placed on the chuck, wherein the substrate is aligned on the basis of a detection result by the position detection section, and then, the substrate is exposed using the pattern, the position detection section comprising an extraction section for observing the mark and extracting edge information of the mark, a position determination section for comparing the edge information with a template and evaluating a comparison result to determine the position of the mark, and a control section for changing at least one of an extraction rule in the extraction section and an evaluation rule in the position determination section on the basis of the evaluation result by the position determination section and causing the extraction section and the position determination section to execute processing again.

According to the fifth aspect of the present invention, there is provided a position detection method of detecting a position of a mark on an object, comprising the extraction step of observing the mark and extracting a plurality of edge information data of the mark in correspondence with attribute information representing features of the edge information, respectively, the position determination step of comparing each edge information data with one of a plurality of templates, which is specified by attribute information corresponding to the edge information and evaluating a plurality of comparison results obtained by comparison to determine the position of the mark, and the control step of changing at least one of an extraction rule in the extraction step and an evaluation rule in the position determination step on the basis of the plurality of comparison results in the position determination step and causing the extraction step and the position determination step to execute processing again.

According to the sixth aspect of the present invention, there is provided a position detection method of detecting a position of a mark on an object, comprising the extraction step of observing the mark and extracting edge information of the mark, the position determination step of comparing the edge information with a template and evaluating a comparison result to determine the position of the mark, and the control step of changing at least one of an extraction rule in the extraction step and an evaluation rule in the position determination step on the basis of the evaluation result in the position determination step and causing the extraction step and the position determination step to execute processing again.

Further objects, features and advantages of the present invention will become apparent from the following detailed description of the embodiments of the present invention with reference to the accompanying drawings.

BRIEF DESCRIPTION OF THE DRAWINGS

FIGS. 2A to 2C are schematic views of exposure apparatuses according to preferred embodiments;

DETAILED DESCRIPTION OF THE PREFERRED EMBODIMENTS

Figure 2A:
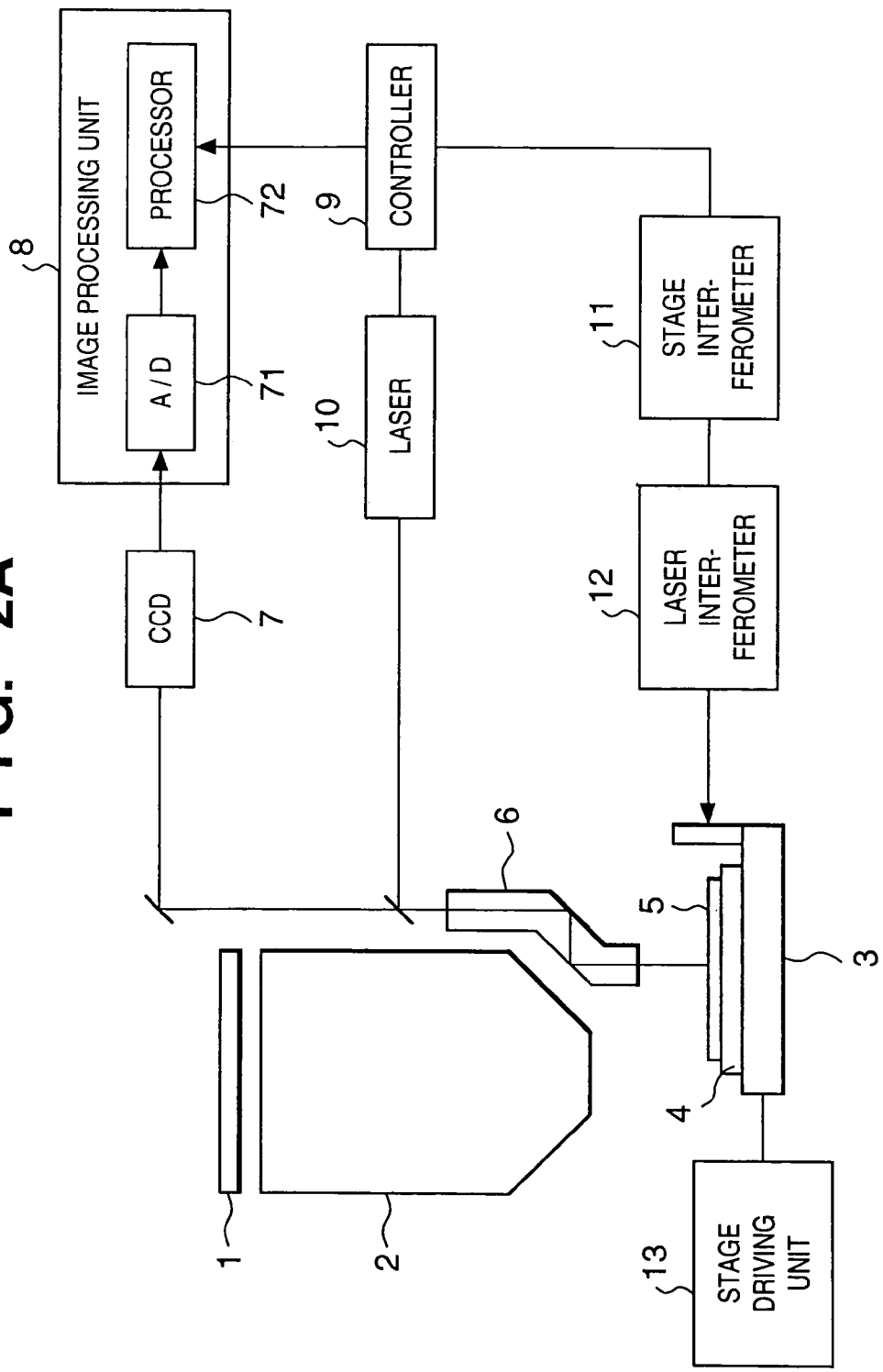

FIG. 2A is a view showing the schematic arrangement of a semiconductor exposure apparatus according to a preferred embodiment of the present invention. In this exposure apparatus, a mark for pre-alignment is detected using an off-axis scope 6.

A pattern for exposure is formed on a reticle 1. The pattern is illuminated with, e.g., an i-line or excimer laser light source of an illumination system (not shown) and projected onto a wafer 5 through a projecting lens 2.

Pre-alignment is performed after the wafer 5 is placed on a wafer chuck 4 on an X-Y stage 3 by a wafer conveyor apparatus (not shown). Since the wafer 5 is placed on the wafer chuck 4 at the accuracy depending on the conveyor apparatus, the alignment accuracy is low. Hence, accurate wafer position measurement cannot be directly started. To do this, a pre-alignment (coarse alignment) mark on the wafer is observed with the off-axis scope 6 arranged outside the projecting lens 2, the optical image of the mark is photoelectrically converted by a CCD camera 7, and then the position information of the mark is detected by a pre-alignment image processing unit 8. In the pre-alignment image processing unit 8, the photoelectrically converted video signal is converted into digital information by an A/D conversion unit 71, and the pre-alignment mark position is detected by an image processor 72 having an image memory.

Figure 6F:
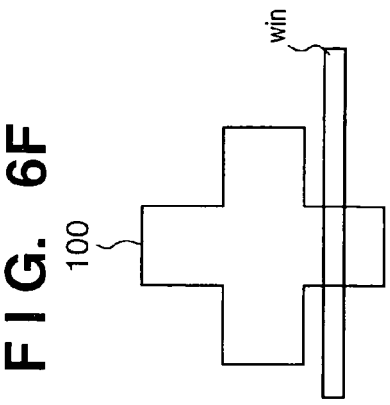
FIGS. 6A to 6H are views showing pre-alignment marks and their step differences and video signals.
Figure 6G:
Figure 6H:
Figure 6A:
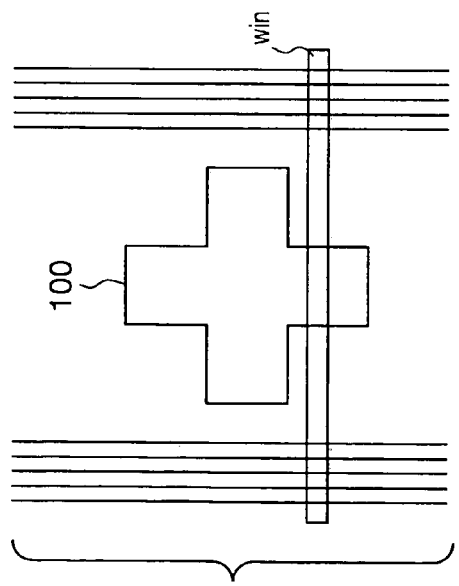
Figure 6B:
Figure 6C:
Figure 6D:
Figure 6E:

It is advantageous when both the X- and Y-coordinates can be detected by one mark. For this reason, the pre-alignment mark has the same shape as that of the mark 100 shown in FIG. 6A. The position of the X-Y stage 3 when the pre-alignment mark image is caputured is accurately measured by a laser interferometer 12. On the basis of the mark position shift and the position of the X-Y stage 3, a controller 9 accurately measures the shift amount of the wafer 5 placed on the chuck 4. The X-Y stage 3 is driven by a stage driving unit 13.

In this embodiment, a case wherein dark field illumination is employed as illumination for the off-axis scope 6 will be described. In dark field illumination, scattered light from an edge position of the mark step difference is received by the CCD camera 7. The present invention can also be applied to bright field illumination.

Figure 1:
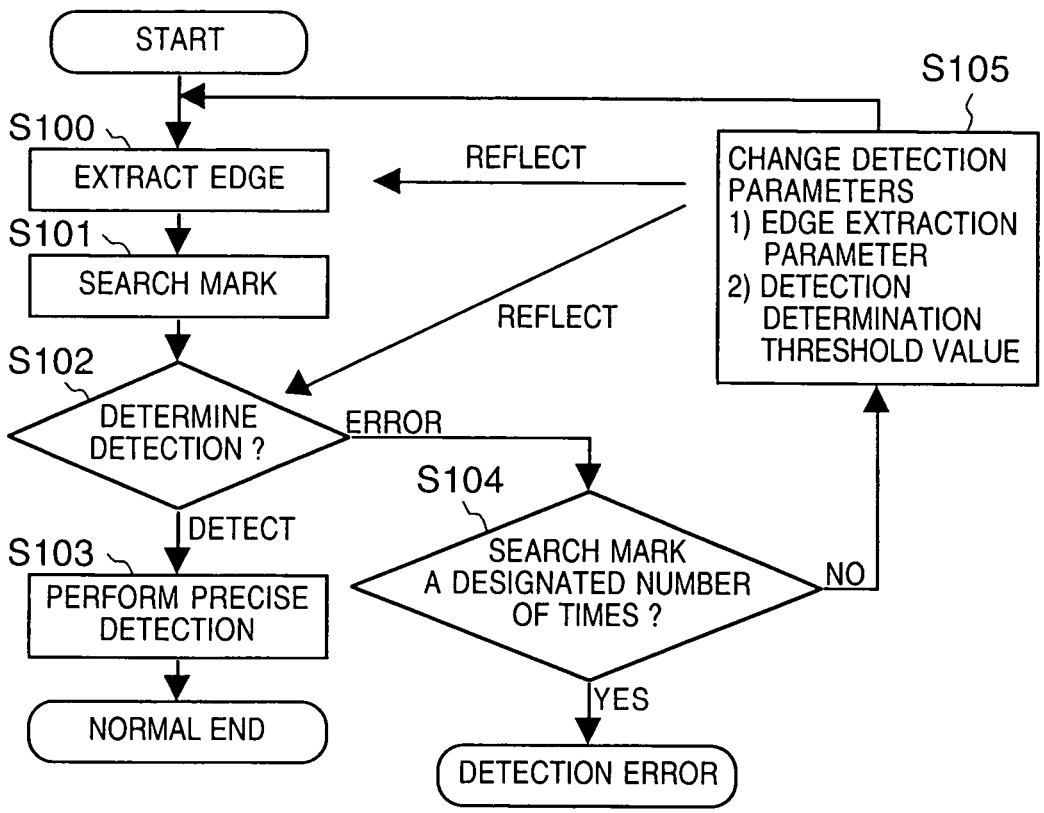
FIG. 1 is a flow chart of image processing in an exposure apparatus according to a preferred embodiment of the present invention.

FIG. 1 shows the flow of image processing (position detection processing) for executing pre-alignment in a position detection apparatus according to the preferred embodiment of the present invention and a semiconductor exposure apparatus using the position detection apparatus.

First, the vector correlation method (S100, S101, S102) will be described.

In step S100, the image processor 72 executes edge extraction processing for an image captured by the CCD camera 7. In edge extraction processing, both the edge information of the mark image and attribute information representing that the edge information is associated with the upper, lower, right, or left side of the mark image are simultaneously acquired.

In this embodiment, edge information (solid lines in FIGS. 4B to 4E) are made to correspond to attribute information ("over", "under", "left", and "right" in FIGS. 4B to 4E) and extracted for four directions of the upper, lower, left, and right sides of an actual edge of the mark image. Edge information may be made to correspond to attribute information and acquired not only for the four directions of the upper, lower, left, and right sides of an actual edge but also for, e.g., four directions that respectively make an angle of 45° with the above four directions, i.e., a total of eight directions. Alternatively, edge information may be made to correspond to attribute information and acquired according to another rule.

In step S101, the mark image is searched on the basis of edge information and attribute information corresponding to the edge information. Searching means detection of an approximate position of the mark image. In searching the mark image, the degree of matching between the edge information extracted in step S100 and a template specified by the attribute information corresponding to the edge information is occasionally calculated while moving the template within a predetermined region, and the center coordinates of the mark (center coordinates of the template) at which the maximum degree of matching is obtained are determined. Each template is formed from feature points of interest corresponding to attribute information, to which attention must be paid in comparison with the edge information extracted from the mark image.

To calculate the degree of matching, the edge information (e.g., FIG. 4B) extracted in step S100 is compared to corresponding feature points of interest (e.g., FIG. 5B) in the template to determine whether the two pieces of information match, and the comparison results are evaluated. More specifically, the degree of matching is calculated by comparing the edge information shown in FIG. 4B with the feature points of interest of the template shown in FIG. 5B, the edge information shown in FIG. 4C with the feature points of interest of the template shown in FIG. 5C, the edge information shown in FIG. 4D with the feature points of interest of the template shown in FIG. 5D, and the edge information shown in FIG. 4E with the feature points of interest of the template shown in FIG. 5E while changing the center coordinates (position of +) and evaluating the number of matches obtained. The center coordinates of a template, at which the maximum degree of matching is obtained, is detected as the position of the mark image.

It is determined in step S102 whether the mark position search is successful. More specifically, when the matching result (maximum degree of matching) has a value equal to or larger than a threshold value for detection determination, it is determined that mark position detection is successful, and the position of the mark is precisely measured in step S103.

Mark position search fails in step S102 when 1) the matching result (maximum degree of matching) has a value smaller than the threshold value for detection determination or 2) a degree of matching equal to or higher than the level of threshold value for detection determination is obtained at a plurality of mark positions, and one of them cannot be selected.

Processing of a characteristic feature of the present invention starts from step S104.

If mark position search fails, the flow advances the loop including step S104 to change parameters for detection, i.e., to adjust one or both of the edge extraction processing parameter and the threshold value for detection determination, and edge extraction (S100), mark position search (S101), and detection determination (S102) are performed again. The repetitive loop of parameter change and search is controlled on the basis of the number of times or conditions set in advance. If it is determined that the mark position cannot be accurately detected any more even by repeating the repetitive loop, a detection error occurs.

Actual processing according to the flow will be described next with reference to FIGS. 3 and 4A to 4E. First, vector correlation will be described. In edge extraction in step S100, scattered light from the mark 100 is received and photoelectrically converted by the CCD camera 7, then A/D-converted by the A/D conversion unit 71, and stored in the image memory of the processor 72.

An image signal along a given scanning line (row) of the stored image is represented by Xi. Since this embodiment employs dark field illumination, the image signal Xi has a certain value at the mark edge position and a value of black level at the remaining portions. A signal obtained by differentiating the image signal Xi is a differential signal Xid. When the scanning line is traced from the left to the right, the differential signal Xid becomes positive at the leading edge portion of the image signal Xi and negative at the trailing edge portion.

A threshold value thl is set on the positive side of the differential signal Xid. When the differential signal Xid is binarized using the threshold value thl as a reference, a left edge signal Le is obtained. In a similar way, when a threshold value thr is set on the negative side of the differential signal Xid, and the signal Xid is binarized using the threshold value thr as a reference, a right edge signal Re is obtained. The left edge signal Le represents the left edge position of the mark image, and the right edge signal Re represents the right edge position of the mark image. When the above processing is executed for all scanning lines, pieces of edge information representing the left edge positions of the mark image and pieces of edge information representing the right edge positions are obtained.

An image signal along a vertical line (column) on the image memory is represented by Yi. Like the image signal Xi, the image signal Yi is traced from the lower side to the upper side, and a differential signal Yid is generated. When the differential signal Yid is binarized using threshold values thu and tho, an under edge signal Ue and over edge signal Oe are obtained. The under edge signal Ue represents the under edge position of the mark image, and the over edge signal Oe represents the over edge position of the mark image. When the above processing is executed for all vertical lines, pieces of edge information representing the under edge positions of the mark image and pieces of edge information representing the over edge positions are obtained.

Figure 4A:
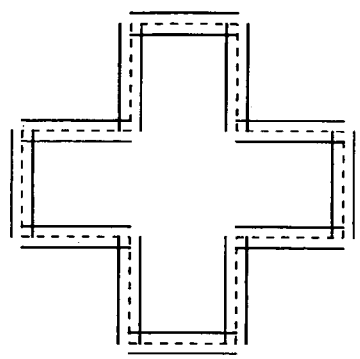
FIG. 4A is a view showing synthesized edge portions extracted from a pre-alignment mark image.

In FIG. 4A, edge information representing the right edge positions, edge information representing the left edge positions, edge information representing the over edge positions, and edge information representing the under edge positions all of the mark 100 are synthesized and two-dimensionally illustrated. In this embodiment, as edge position images (edge information and attribute information), edge information associated with attribute information "over" shown in FIG. 4B, edge information associated with attribute information "under" shown in FIG. 4C, edge information associated with attribute information "left" shown in FIG. 4D, edge information associated with attribute information "right" shown in FIG. 4E are stored in the processor 72 as independent information.

Mark image search (S101) is performed by matching calculation of templates stored in advance and edge position images (edge information) shown in FIGS. 4B to 4E.

FIGS. 5A to 5E are views for explaining the templates.

Figure 5A:
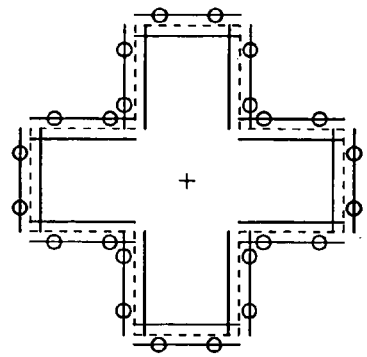
FIG. 5A is a view showing synthesized templates according to the preferred embodiment of the present invention.

Since the positions of the over, under, left, and right edges relative to the mark center (cross) are known, the templates are registered as layouts shown in FIGS. 5B to 5E in which feature portions of the mark are indicated by open circles. That is, the templates can be determined on the basis of the shape of the mark to be formed on the wafer. FIG. 5A shows the synthesized image of the four registered templates shown in FIGS. 5B to 5E. In this embodiment, the position of an open circle is called a feature point of interest, and a set of points of interest is called a template. In each template of this embodiment, feature points of interest are defined on only one side edges of the mark. For example, in the template shown in FIG. 5B, the feature points of interest are defined on only the over edges of the mark.

Figure 4B:
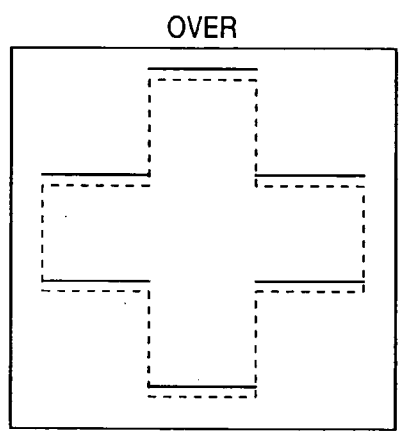
FIGS. 4B to 4E are views showing edge components (edge information) extracted from the pre-alignment mark image.
Figure 4C:
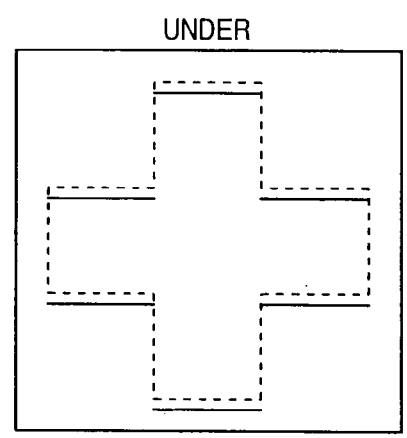
Figure 4D:
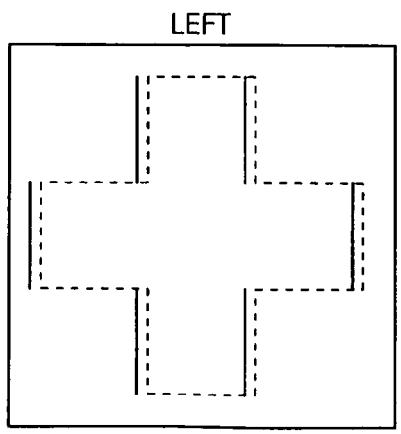
Figure 4E:
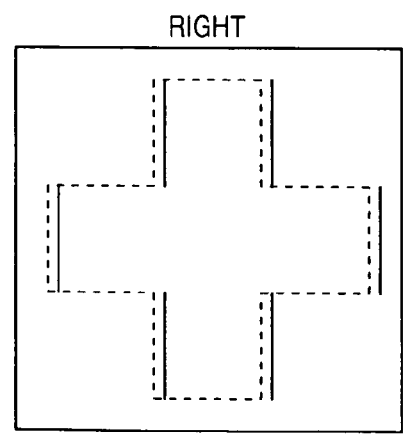
Figure 5B:
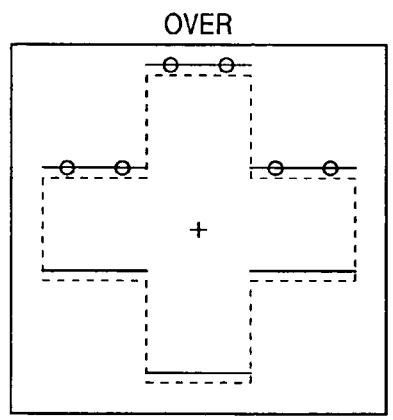
FIGS. 5B to 5E are views showing templates according to the preferred embodiment of the present invention.
Figure 5C:
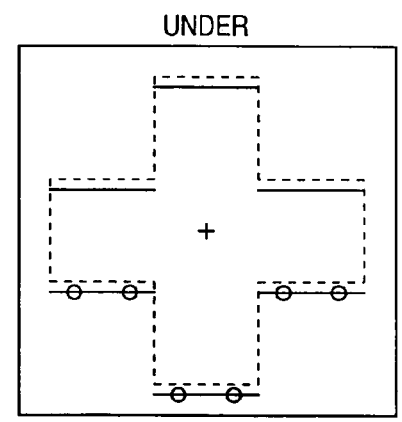
Figure 5D:
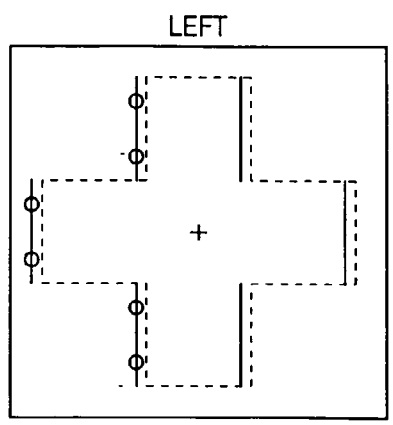
Figure 5E:
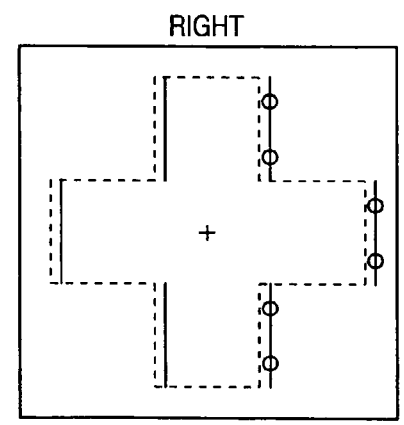

Matching calculation in a mark image search is performed by determining whether, e.g., the pieces of edge information shown in FIG. 4B are present at the positions of open circles in FIG. 5B with reference to the mark center (cross). In a similar way, FIG. 4C and FIG. 5C, FIG. 4D and FIG. 5D, FIG. 4E and FIG. 5E are compared to determine whether the pieces of edge information shown in FIGS. 4C to 4E are present at the position of open circles in FIGS. 5C to 5E, respectively. When the edge information are present at all the hollow bullet positions, the degree of matching is 100%. If some hollow bullet positions have no edge information, the degree of matching is lower than 100%. The above matching calculation is performed for the entire edge images while changing the mark center coordinates, and mark center coordinates at which the degree of matching is highest are finally extracted, thereby completing the search.

The feature points of interest shown in FIGS. 5B to 5E are defined by thinning out points and designating two points that define specific edges. Even when the number of feature points of interest is increased, no effect is obtained unless they express the characteristic feature of the mark shape. If the feature points of interest are densely defined, the degree of matching becomes low due to various reasons, and the mark image may not be detected. Especially, when the mark is damaged, the degree of matching often extremely lowers. For this reason, a high detection rate can be stably obtained by setting thinned out feature points of interest, as described above.

Vector correlation has been described above.

When the maximum degree of matching obtained by the above-described search is lower than the level of threshold value for determination, the coordinates at which the maximum degree of matching is obtained may not indicate the correct mark position. In this case, edge information extraction may not be optimum. Hence, preferably, the threshold values thl, thr, thu, and tho used for extraction of mark edge information are corrected, the edge information data are generated again; and the search is repeated.

For example, when the threshold values thl, thr, thu, and tho for edge information is obtained from a low-contrast mark image. Hence, the degree of matching in the search is low, and mark detection determination is impossible. Preferably, the edge information of the mark is detected while gradually decreasing the threshold value for edge extraction. This makes it possible to obtain a sufficient degree of matching in the search.

As another example, when there are a plurality of coordinates at which a degree of matching higher than the level of threshold value for determination, the mark position cannot be determined. In this case as well, the mark position can be reliably determined by increasing the determination threshold value and repeating edge information generation and search.

The position detection parameter such as the threshold value for edge extraction or threshold value for determination can be efficiently changed by storing, e.g., a value determined according to the immediately preceding search processing result (degree of matching) in the memory and using the value as the base (e.g., initial value) for detection parameter determination of the next time.

For precise detection (S103) after the end of the mark image search, the mark position can be determined at an accuracy beyond the pixel resolution by, e.g., a method of obtaining the barycenter on the basis of the luminance distribution with an origin set at the center coordinates of the M/D-converted image found by the search.

In this embodiment, edge extraction is performed immediately after image reception. Processing of performing noise removal filtering before edge extraction to lower the noise level in advance and prevent any unnecessary edge information, or forming a bold line image as edge information to correct deformation in mark size or omission of edges is also effective. Addition of the above processing results in an increase in detection rate in the mark search.

In the first embodiment, the position detection apparatus of the present invention and the semiconductor exposure apparatus using the position detection apparatus are applied to pre-alignment using the off-axis scope 6. However, the process of the mark position search is not limited to pre-alignment using off-axis.

FIG. 2B shows the second embodiment in which the position detection apparatus of the present invention is applied to a TTR detection system for detecting a mark on a wafer 5 or stage through a reticle 1 in a semiconductor exposure apparatus.

To detect a mark in the TTR detection system, exposure light is used. For example, in a semiconductor exposure apparatus using an excimer laser, a CCD camera 7 and laser 21 are synchronized by a sync signal generator 20 to emit a laser beam only during the light storage time of the CCD camera 7. For the photoelectrically converted mark image, the mark position search is done by the same method as in the first embodiment, and after the search, an accurate mark position can be calculated. In an i-line exposure apparatus, since the light source is not a laser, synchronization between image reception and the illumination system is unnecessary. For this reason, the mark position search can be done, and accurate mark position calculation can be performed after the search, as in the first embodiment.

In reticle alignment for alignment of the reticle 1 with respect to a projecting lens 2 as well, the same processing as in the first embodiment can be performed for a mark search.

Figure 2C:
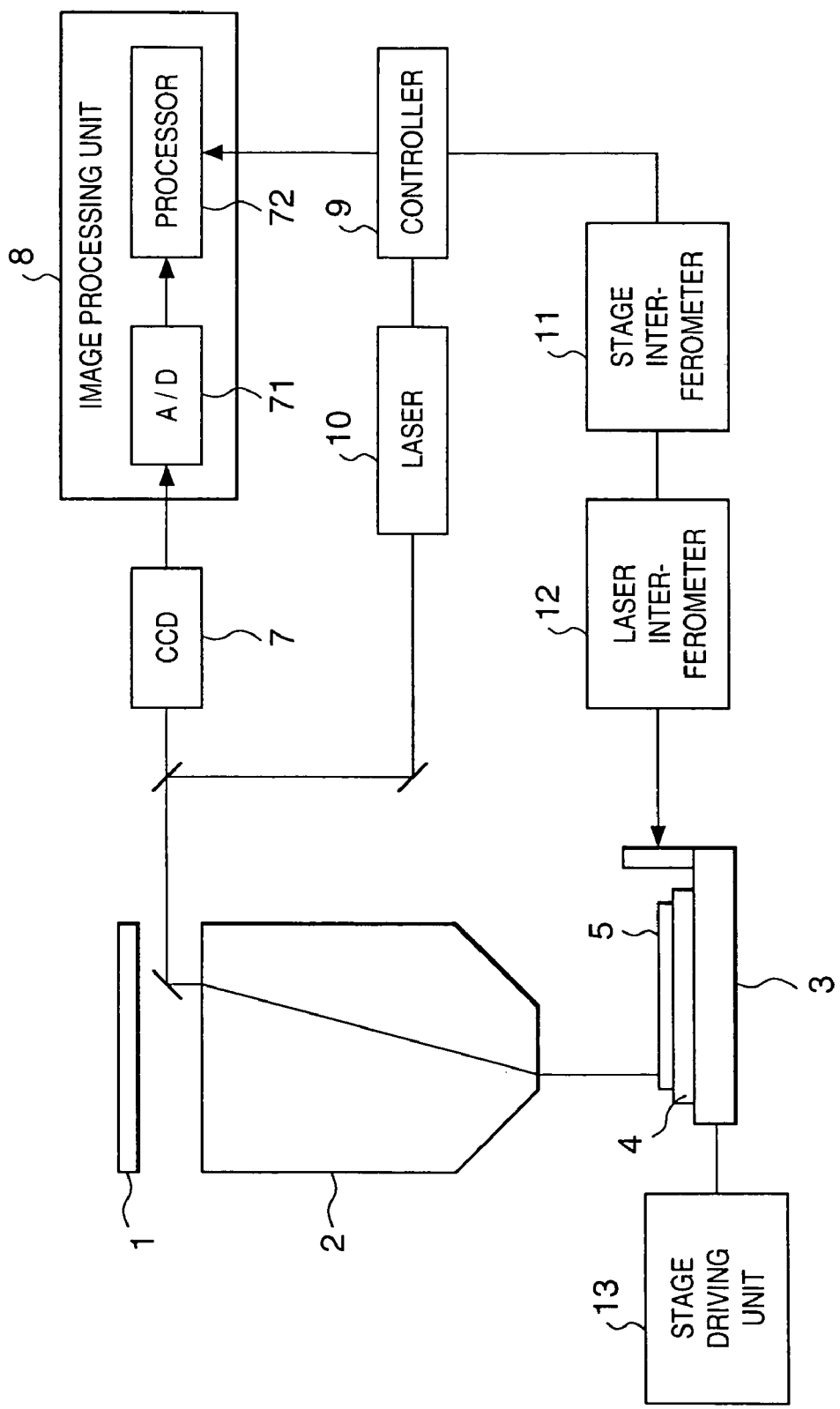
Figure 3:
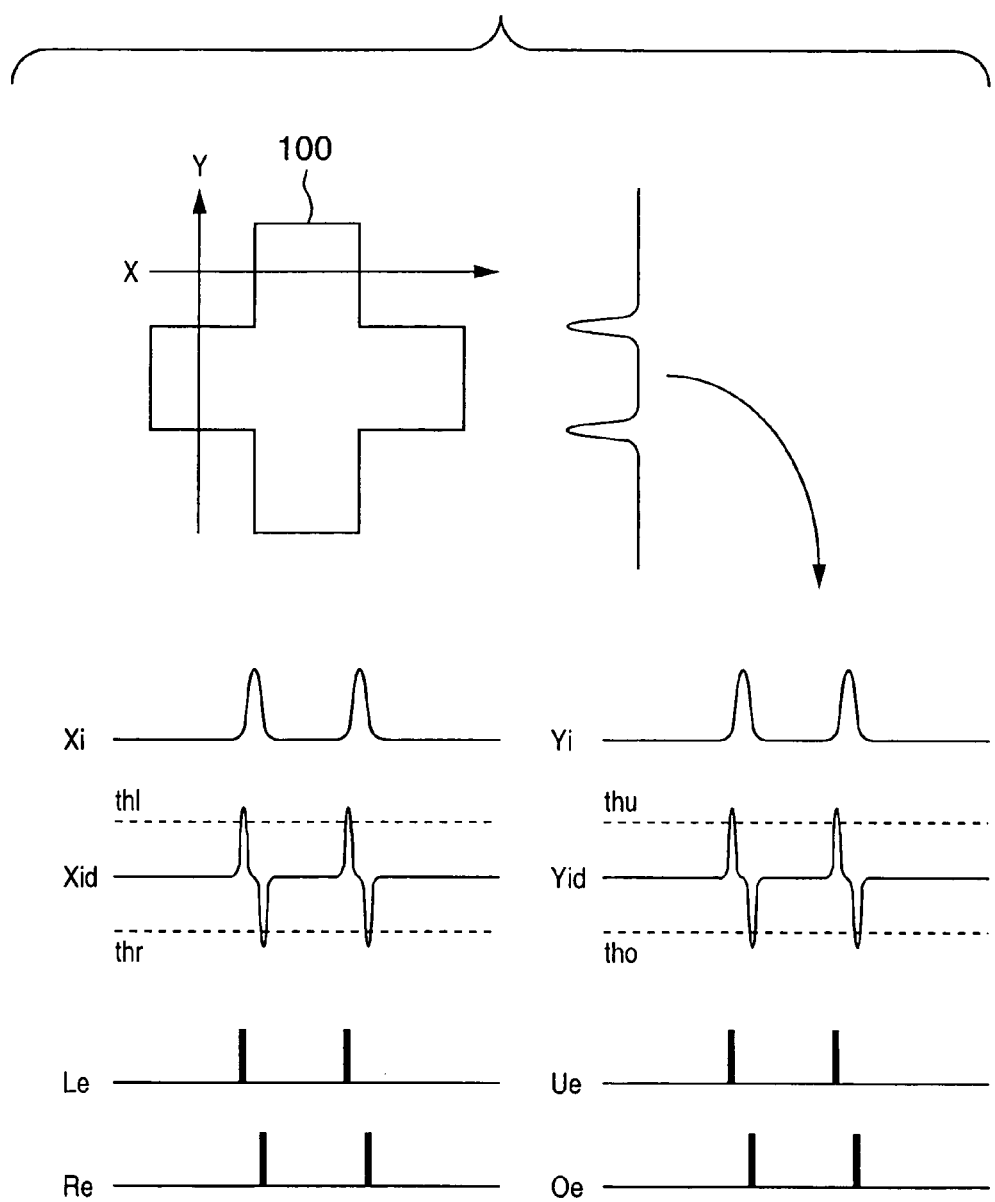
FIG. 3 is a view for explaining mark edge extraction processing in the preferred embodiment of the present invention.

FIG. 2C shows the third embodiment of the present invention in which the position detection apparatus of the present invention is applied to a TTL detection system for detecting the mark position on a wafer 5 or stage 3 through a projecting lens 2 without interposing a reticle 1 in a semiconductor exposure apparatus. In TTL as well, the mark search and position determination can be performed by the same method as that of the first embodiment except that the mark image sensing method is different.

As has been described above, in the position detection apparatus according to the preferred embodiment of the present invention and the semiconductor exposure apparatus using the position detection apparatus, the edge information of a mark image is extracted in correspondence with attribute information, the edge information is compared with a corresponding template in units of partial edges on the basis of the attribute information, and the obtained comparison result is evaluated, thereby determining the mark position. Since it can be determined at high probability in units of partial edges whether a partial edge (e.g., FIG. 4B) and a template (e.g., FIG. 5B) corresponding to the edge match, the probability of mark position detection becomes higher than that of the prior art in which it is determined whether the entire mark image matches the template. Hence, according to this embodiment, the position of the image of a mark with degradation or a defect generated in manufacturing a high-density semiconductor device, e.g., a low-contrast mark image, a noisy mark image, or a mark image obtained by sensing a defect generated in the wafer process can be more stably detected.

As a consequence, in this position detection apparatus and semiconductor exposure apparatus using the position detection apparatus, by repeating pattern matching while adjusting one or both of the edge extraction parameter and parameter used to determine the matching result in accordance with the result of template matching, the image of a mark with degradation or a defect can be more reliably detected.

The present invention is not limited to the above embodiments and various changes and modifications can be made within the spirit and scope of the present invention. Therefore, to apprise the public of the scope of the present invention, the following claims are made.

What is claimed is:

1. An exposure apparatus comprising:
a projection optical system for projecting a pattern onto a substrate;
a chuck on which the substrate is placed; and
a position detection section for detecting a position of a mark on the substrate placed on said chuck,
wherein the substrate is aligned on the basis of a detection result by said position detection section, and then, the substrate is exposed using the pattern,
said position detection section comprising:
an extraction section for observing the mark and extracting a plurality of edge information of the mark in correspondence with attribute information representing features of the edge information, respectively;
a position determination section for comparing each edge information with one of a plurality of templates, which is specified by attribute information corresponding to the edge information and evaluating a plurality of comparison results obtained by comparison to determine the position of the mark; and
a control section for changing at least one of an extraction rule in said extraction section and an evaluation rule in said position determination section on the basis of the plurality of comparison results by said position determination section and causing said extraction section and said position determination section to execute processing again.

2. The apparatus according to claim 1, wherein said extraction section of said position detection section observes the mark with an off-axis scope.

3. The apparatus according to claim 1, wherein said extraction section of said position detection section observes the mark by TTR (Through The Reticle).

4. The apparatus according to claim 1, wherein said extraction section of said position detection section observes the mark by TTL (Through The Lens).

5. The apparatus according to claim 1, wherein each attribute information represents an edge portion of the mark, which is associated with the corresponding edge information.

6. The apparatus according to claim 1, wherein each attribute information represents one of a plurality of extraction conditions under which the corresponding edge information is extracted.

7. The apparatus according to claim 1, wherein said extraction section extracts, as each edge information, information representing an edge position shifted from an actual edge position of the mark by a predetermined distance in one of a plurality of predetermined directions, and each attribute information represents a direction in which an edge position associated with the corresponding edge information is shifted from the actual edge position of the mark by the predetermined distance.

8. The apparatus according to claim 1, wherein said extraction section comprises:
an image sensing section for sensing an image of the mark;
a differential processing section for differentiating the mark image as an image sensing result; and
an edge information generation section for processing the differential result to generate the edge information corresponding to the attribute information.

9. The apparatus according to claim 8, wherein said differential processing section calculates a change rate of an image signal of the mark image along at least two directions of the mark image, and
each attribute information is associated with one of the at least two directions.

10. The apparatus according to claim 9, wherein each attribute information is associated with a sign of the differential result by said differential processing section.

11. The apparatus according to claim 8, wherein each attribute information is associated with a sign of the differential result by said differential processing section.

12. The apparatus according to claim 8, wherein said differential processing section calculates a change rate of an image signal of the mark image across the mark image along row and column directions of the mark image, and
each attribute information is associated with one of the row and column directions and the differential result by said differential processing section.

13. The apparatus according to claim 1, wherein each template includes, as information to be compared with the edge information, position information of a plurality of points defining a corresponding edge.

14. The apparatus according to claim 1, wherein each template includes, as information to be compared with the edge information, position information of points on a continuous line defining a corresponding edge.

15. The apparatus according to claim 1, wherein said extraction section performs noise removal processing for an observation result of the mark and then executes edge information extraction.

16. The apparatus according to claim 1, wherein said extraction section increases a line width associated with the extracted edge information.

17. The apparatus according to claim 1, wherein at least one of the extraction rule and the evaluation rule determined by said control section is stored in a memory and used as a base for processing to be executed later.

18. The apparatus according to claim 1, wherein said extraction section observes the mark under dark field illumination.

19. An exposure apparatus comprising:

a projection optical system for projecting a pattern onto a substrate;

a chuck on which the substrate is placed; and a position detection section for detecting a position of a mark on the substrate placed on said chuck, wherein the substrate is aligned on the basis of a detection result by said position detection section, and then, the substrate is exposed using the pattern, said position detection section comprising:

an extraction section for observing the mark and extracting edge information of the mark;

a position determination section for comparing the edge information with a template and evaluating a comparison result to determine the position of the mark; and a control section for changing at least one of an extraction rule in said extraction section and an evaluation rule in said position determination section on the basis of the evaluation result by said position determination section and causing said extraction section and said position determination section to execute processing again.

* * * * *